United States Patent
Wakimoto et al.

(10) Patent No.: US 6,617,519 B2
(45) Date of Patent: Sep. 9, 2003

(54) FLEXIBLE PRINTED CIRCUIT BOARD AND MANUFACTURING METHOD

(75) Inventors: Yuji Wakimoto, Minato-ku (JP); Toshihiro Watanabe, Minato-ku (JP); Ryuji Moriya, Minato-ku (JP)

(73) Assignee: Nippon Mektron, Ltd., Tokyo-to (JP)

( * ) Notice: Subject to any disclaimer, the term of this patent is extended or adjusted under 35 U.S.C. 154(b) by 0 days.

(21) Appl. No.: 10/075,379

(22) Filed: Feb. 15, 2002

(65) Prior Publication Data
US 2002/0112880 A1 Aug. 22, 2002

(30) Foreign Application Priority Data
Feb. 16, 2001 (JP) .......................... 2001-039606

(51) Int. Cl.[7] .................................. H05K 1/00
(52) U.S. Cl. ........................ 174/254; 174/260
(58) Field of Search ................. 174/254, 260, 174/268; 361/749–751

(56) References Cited

U.S. PATENT DOCUMENTS

| | | | | |
|---|---|---|---|---|
| 4,800,461 A | * | 1/1989 | Dixon et al. | 361/398 |
| 4,931,134 A | * | 6/1990 | Hatkevitz et al. | 156/630 |
| 5,144,742 A | * | 9/1992 | Lucus | 29/830 |
| 5,499,444 A | * | 3/1996 | Doane, Jr. et al. | 29/830 |
| 5,633,480 A | * | 5/1997 | Sato et al. | 174/255 |
| 5,717,556 A | * | 2/1998 | Yanagida | 361/803 |
| 6,099,745 A | * | 8/2000 | McKenney et al. | 261/13 |
| 6,288,343 B1 | * | 9/2001 | Ahn et al. | 174/254 |

* cited by examiner

Primary Examiner—David L. Talbott
Assistant Examiner—Jeremy Norris
(74) Attorney, Agent, or Firm—Foley & Lardner

(57) ABSTRACT

A flexible printed circuit board including a component mount section, which an electronic component is mounted on, and a cable section, which connects to the component mount section; circuit patterns being provided on the cable section, and covered by a soft laminated adhesive.

6 Claims, 1 Drawing Sheet

FLEXIBLE PRINTED CIRCUIT BOARD AND MANUFACTURING METHOD

BACKGROUND OF THE INVENTION

1. Field of the Invention

The present invention relates to a flexible printed circuit board having a multilayer circuit, and more particularly relates to the flexible printed circuit board having a component mount section and a cable section which is connected thereto.

2. Description of the Related Art

Printed circuit boards in electronic devices are used for mounting electronic components and connecting circuits, comprising the electronic components, by means of circuit patterns. A flexible printed circuit board is generally used as a printed circuit board for miniaturized electronic devices.

In miniaturized electronic devices, solid component mounting is often required to make the device more compact. To achieve solid component mounting, the present applicants provided a printed circuit board which combines a thick component mount section with a thin bendable cable section (Japanese Patent Application 284240/1999).

FIG. 2 shows the cross-sectional view of this type of flexible printed circuit board. A cover film 2 is pasted on each side of an inner-layer material 1, which has a circuit pattern on each side, and an outer-layer material 4 is provided over the cover films 2 of the component mount sections with an inter-layer adhesive 3 therebetween.

In this printed circuit board, the cover film is pasted over the outermost layer in order to insulate and protect the cable. Since positioning becomes difficult when the cover film is pasted only over the cable section, the cover film is also pasted over the component mount sections. As a result, the thickness of the flexible printed circuit board includes the cover film.

However, there is a constant demand for thinner and smaller miniaturized electronic devices, especially portable ones. Consequently, there is a demand to reduce the thickness of the cover film.

SUMMARY OF THE INVENTION

The present invention has been realized in consideration of the points mentioned above, and aims to provide a flexible printed circuit board which has a smaller overall thickness and a method for manufacturing the flexible printed circuit board.

In order to achieve the above objects, the present invention provides a flexible printed circuit board comprising a component mount section, which an electronic component is mounted on, and a cable section, which connects to the component mount section; circuit patterns being provided on the cable section and covered by a soft laminating adhesive.

The present invention also provides a method for manufacturing a flexible printed circuit board having a component mount section, which comprises an outer-layer material laminated on an inner-layer material with an insulating cover therebetween, and a cable section, which comprises the inner-layer material covered by the insulating cover and connects to the component mount section. The method comprises covering the inner-layer material of the component mount section and the cable section with a soft laminating adhesive.

DESCRIPTION OF THE PREFERRED EMBODIMENT

Figure 1:
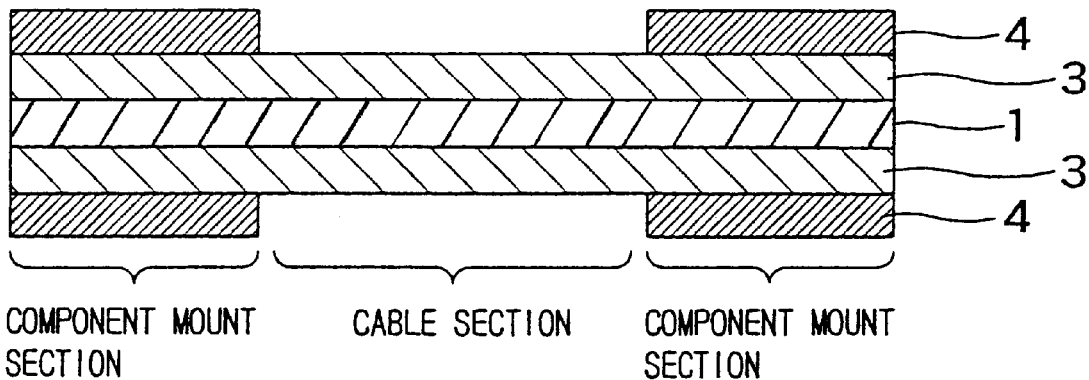
FIG. 1 is a diagram showing the cross-sectional view of an embodiment of this invention.
Figure 2:
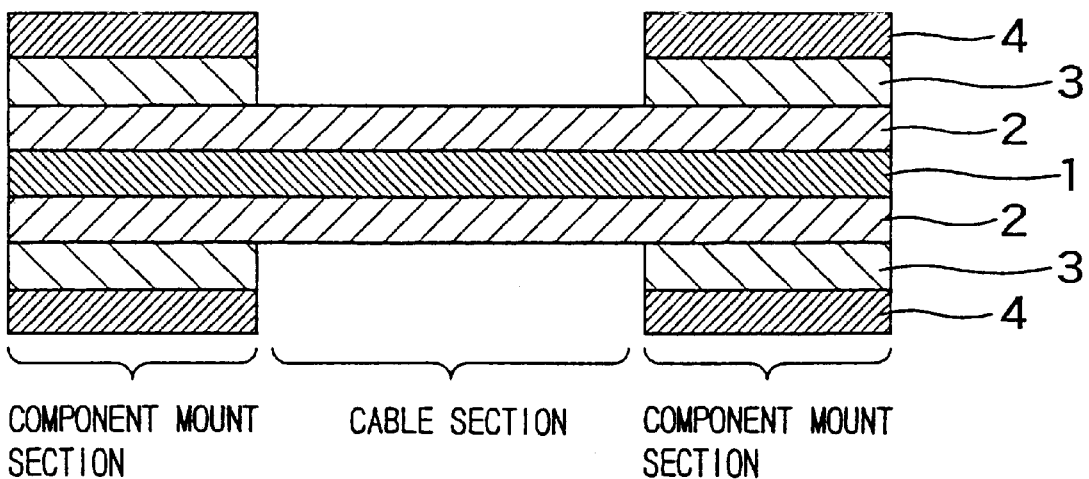
FIG. 2 is a diagram showing the cross-sectional view of a conventional flexible printed circuit board.

FIG. 1 shows the cross-sectional view of a four-layered embodiment of this invention. In this embodiment, a cover film 2 is not pasted on each side of the inner-layer material 1 as in the conventional flexible printed circuit board shown in FIG. 2; instead, these sides are covered with an inter-layer (laminating) adhesive 3.

Therefore, in the cable section, the sides of the inner-layer material 1 are covered only by the laminating adhesive 3. That is, the inner-layer material 1 is covered by the laminating adhesive 3 instead of by the conventional cover film 2, so that the laminating adhesive 3 becomes the outermost layer of the cable section.

Since the laminating adhesive 3 is the outermost layer of the cable section, it is preferable that the material used for the laminating adhesive should be properly hard and soft enough to function as a cable section while capable of maintaining an average thickness. Materials, which satisfy these conditions, include polyimide and acrylic adhesives. A thin film of such material can be provided evenly over the surface of the inner-layer material 1.

An outer-layer material 4 is provided over the laminating adhesive 3 in the component mount sections, thereby making them thick enough and strong enough to mount components on.

The above embodiment is manufactured by the following steps.

(1) A two-layered circuit is made by providing circuit patterns on each side of the inner-layer material 1, comprising a layered plate which is copper-plated on both sides.

(2) Then, a cable section is made by punching both sides of the cable section in the inner-layer material 1.

(3) Both side sections of the cable section are punched in a laminating adhesive 3.

(4) An outer-layer material 4, comprising laminated plates which are copper-plated on one side, is provided on the component mount sections with the laminating adhesive 3 therebetween.

(5) Thereafter, processes of making holes, plating through-hole, forming patterns in the outer-layers, and external shaping, are carried out in the same way as when manufacturing a conventional printed circuit board.

These processes complete the manufacture of the flexible printed circuit board, wherein the component mount sections are connected by the cable section.

A four-layered flexible printed circuit board is described in the above embodiment by way of example, but this invention can be applied in multilayer printed circuit boards having a number of layers other than four.

As described above, according to this invention, the circuit patterns are provided on the cable section, and are covered by the soft laminated adhesive; therefore, there is no need for a conventional cover film, and the laminating adhesive can be made thinner than the cover film. As a result, the flexible printed circuit board can be made thinner, aiding the miniaturization of the electronic device which the flexible printed circuit board is incorporated in.

What is claimed is:

1. A flexible printed circuit board comprising a component mount section, which an electronic component is mounted on, and a cable section, which connects to the component mount section;

circuit patterns being provided in the cable section, and covered by a soft laminated adhesive, the adhesive being the outermost layers of the cable section, the laminating adhesive comprising a polyimide adhesive.

2. A flexible printed circuit board comprising a component mount section, which an electronic component is mounted on, and a cable section, which connects to the component mount section;

circuit patterns being provided in the cable section, and covered by a soil laminated adhesive, the adhesive being the outermost layers of the cable section, the laminating adhesive comprising an acrylic adhesive.

3. A flexible printed circuit hoard having a cable section connected to at least one component mount section comprising:

a circuit strata comprising at least one circuit layer, the circuit strata comprising all the circuit layers of the circuit board, wherein the circuit strata is located in both the cable section and at least one component mount section, the strata of the cable section connecting to the strata of at least one component mount section; wherein;

at least one circuit pattern is provided in at least one of the circuit layers in the cable section of the circuit strata, wherein at least one of the top and bottom of the circuit strata is covered by a soft laminated adhesive, wherein the printed circuit board is adapted on at least one mount section to permit an electronic component to be mounted on the component mount section, and wherein the soft laminated adhesive comprises polyimide.

4. A flexible printed circuit board having a cable section connected to at least one component mount section comprising:

a circuit strata comprising at least one circuit layer, the circuit strata comprising all the circuit layers of the circuit board, wherein the circuit strata is located in both the cable section and at least one component section, the strata of the cable section connecting to the strata of at least one component mount section; wherein at least one circuit pattern is provided on at least one of the circuit layers in the cable section of the circuit strata, wherein at least one of the top and bottom of the circuit strata is covered by a soft laminated adhesive, wherein, the printed circuit board is adapted at least one mount section to permit an electronic component to be mounted on the component mount section, and wherein the soft laminated adhesive comprises acrylic.

5. A flexible printed circuit board having a cable section connected to at least one component mount section comprising:

a circuit strata comprising at least one circuit layer, the circuit strata comprising all the circuit layers of the circuit board, wherein the circuit strata is located in both the cable section and at least one component section, the strata of the cable section connecting to the strata of at least one component mount section; wherein at least one circuit pattern is provided in at least one of the circuit layers in the cable section of the circuit strata, wherein at least one of the top and bottom of the circuit strata of the cable section is covered only by an adhesive, and wherein the adhesive comprises polyimide.

6. A flexible printed circuit board having a cable section connected to at least one component mount section comprising:

a circuit strata comprising at least one circuit layer, the circuit strata comprising all the circuit layers of the circuit board, wherein the circuit strata is located in both the cable section and at least one component section, the strata of the cable section connecting to the strata of at least one component mount section; wherein at least one circuit pattern is provided in at least one of the circuit layers in the cable section of the circuit strata, wherein at least one of the top and bottom of the circuit strata of the cable section is covered only by an adhesive, and wherein the adhesive comprises acrylic.

* * * * *